(12) United States Patent
Matsushita

(10) Patent No.: US 6,785,155 B2
(45) Date of Patent: Aug. 31, 2004

(54) FERROELECTRIC MEMORY AND OPERATING METHOD THEREFOR

(75) Inventor: Shigeharu Matsushita, Katano (JP)

(73) Assignee: Sanyo Electric Co., Ltd., Osaka (JP)

( * ) Notice: Subject to any disclaimer, the term of this patent is extended or adjusted under 35 U.S.C. 154(b) by 107 days.

(21) Appl. No.: 10/124,262

(22) Filed: Apr. 18, 2002

(65) Prior Publication Data

US 2002/0154533 A1 Oct. 24, 2002

(30) Foreign Application Priority Data

Apr. 19, 2001 (JP) ........................................ 2001-121029

(51) Int. Cl.[7] ............................................. G11C 11/22
(52) U.S. Cl. .................................. 365/145; 365/189.11
(58) Field of Search ................................. 365/145, 117, 365/149, 189.09, 189.11

(56) References Cited

U.S. PATENT DOCUMENTS

| | | | |
|---|---|---|---|
| 5,666,305 A | 9/1997 | Mihara et al. | 365/145 |
| 5,777,921 A | 7/1998 | Takata et al. | 365/145 |
| 5,835,399 A * | 11/1998 | Jeon | 365/145 |
| 5,978,253 A * | 11/1999 | Lee et al. | 365/145 |
| 6,088,257 A * | 7/2000 | Jeon et al. | 365/145 |
| 6,114,861 A | 9/2000 | Takeo | 324/658 |
| 6,157,563 A | 12/2000 | Hirano et al. | 365/145 |
| 6,510,072 B2 * | 1/2003 | Kang | 365/145 |

FOREIGN PATENT DOCUMENTS

| | | |
|---|---|---|
| EP | 0 908 892 A2 | 4/1999 |
| JP | 02-154389 | 6/1990 |
| JP | 9-091970 | 4/1997 |
| JP | 9-265784 | 10/1997 |
| JP | 10-112191 | 4/1998 |
| JP | 11-086534 | 3/1999 |
| JP | 2000-235794 | 8/2000 |
| JP | 2000-269444 | 9/2000 |
| JP | 2001-1267584 | 6/2001 |

OTHER PUBLICATIONS

International Search Report, PCT/JP02/03713, Apr. 15, 2002.

* cited by examiner

*Primary Examiner*—Tan T. Nguyen
(74) *Attorney, Agent, or Firm*—Arent Fox Kintner Plotkin & Kahn, PLLC

(57) ABSTRACT

A ferroelectric memory capable of avoiding disturbance in non-selected cells is obtained. This ferroelectric memory comprises pulse application means for applying pulses having a prescribed pulse width causing sufficient polarization inversion when applying a high voltage to the ferroelectric capacitors while hardly causing polarization inversion when applying a low voltage to the ferroelectric capacitors to the memory cells. The ferroelectric memory applies a pulse of a high voltage having the aforementioned prescribed pulse width to a selected memory cell while applying a pulse of a low voltage having the aforementioned prescribed pulse width to non-selected memory cells in at least either data writing or data reading. Thus, writing or reading is performed on the selected memory cell, while polarization inversion is hardly caused in the non-selected memory cells. Consequently, disturbance can be avoided in the non-selected memory cells.

18 Claims, 8 Drawing Sheets

FERROELECTRIC MEMORY AND OPERATING METHOD THEREFOR

BACKGROUND OF THE INVENTION

1. Field of the Invention

The present invention relates to a ferroelectric memory and an operating method therefor, and more particularly, it relates to a ferroelectric memory having ferroelectric capacitors and an operating method therefor.

2. Description of the Prior Art

A ferroelectric memory is recently watched with interest as a high-speed nonvolatile memory requiring low power consumption. Therefore, such a ferroelectric memory is actively subjected to research and development.

FIG. 7 is a representative circuit diagram of a conventional ferroelectric memory most generally in use, and FIG. 8 is a sectional view corresponding to FIG. 7. Referring to FIGS. 7 and 8, element isolation regions 102 are formed on prescribed areas of the surface of a semiconductor substrate 101 in the conventional structure. Source/drain regions 103 and 104 are formed on an element forming region enclosed with the element isolation regions 102 at prescribed intervals. Gate electrodes 106 forming word lines (WL) are formed on channel regions located between the source/drain regions 103 and 104 through gate insulator films 105. Bit lines (BL) 113 are electrically connected to the source/drain regions 104.

The source/drain regions 103 are formed with lower electrodes 109 through plug electrodes 108. Upper electrodes 111 forming plate lines (PL) are formed on the lower electrodes 109 through ferroelectric films 110. The lower electrodes 190, the ferroelectric films 110 and the upper electrodes 111 form ferroelectric capacitors 112. The source/drain regions 103 and 104, gate insulator films 105, and the gate electrodes 106 form transistors 107. The transistors 107 function as switches for selecting memory cells 100. As shown in FIG. 7, each memory cell 100 is formed by a single transistor 107 and a single ferroelectric capacitor 112.

In the structure of the conventional ferroelectric memory shown in FIGS. 7 and 8, however, each memory cell 100 formed by a single transistor 107 and a single ferroelectric capacitor 112 disadvantageously requires a relatively large memory cell area.

To this end, there have generally been developed a simple matrix ferroelectric memory forming each memory cell only by a single ferroelectric capacitor and an MFIS-FET (metal ferroelectric insulator semiconductor-field effect transistor) ferroelectric memory or an MFMIS-FET (metal ferroelectric metal insulator semiconductor-field effect transistor) ferroelectric memory forming a ferroelectric capacitor on the gate portion of a transistor.

FIG. 9 is a circuit diagram of a conventional simple matrix ferroelectric memory, and FIG. 10 is a sectional view corresponding to FIG. 9. Referring to FIGS. 9 and 10, ferroelectric layers 202 are formed on bit lines (BL) 201 in the conventional simple matrix ferroelectric memory. Word lines (WL) 203 are formed on the ferroelectric layers 202 in a direction intersecting with the bit lines 201. The bit lines 201, the ferroelectric layers 202 and the word lines 203 form ferroelectric capacitors 210. In this simple matrix ferroelectric memory, each memory cell 200 is formed by only a single ferroelectric capacitor 210, as shown in FIG. 9.

FIG. 11 is a circuit diagram for illustrating a method of applying a voltage in the conventional simple matrix ferroelectric memory shown in FIGS. 9 and 10 in a write operation. Referring to FIG. 11, a voltage $V_{CC}$ is applied across a bit line $BL_1$ and a word line $WL_1$ connected with a selected memory cell (hereinafter referred to as a selected cell) 200 in the conventional simple matrix ferroelectric memory, in order to drive the selected cell 200. In other words, a power supply voltage $V_{CC}$ is applied to the bit line $BL_1$ while applying 0 V to the word line $WL_1$. A voltage $1/3V_{CC}$ is applied to bit lines $BL_0$ and $BL_2$ connected with non-selected memory cells (hereinafter referred to as non-selected cells) 200 while applying a voltage $2/3V_{CC}$ is applied to word lines $WL_0$ and $WL_2$ connected with the non-selected cells 200. Thus, the voltage $V_{CC}$ is applied to the selected cell 200 while the voltage $1/3V_{CC}$ is applied to the non-selected cells 200.

In the above case, it is necessary that polarization inversion is sufficiently saturated for the ferroelectric layer 202 of the selected cell 200 while polarization states remain substantially unchanged for the ferroelectric layers 202 of the non-selected cells 200.

Under the present circumstances, however, the angular shape of ferroelectric hysteresis is so insufficient that information (charge quantity) is lost in the so-called disturbance when the voltage $1/3V_{CC}$ is continuously applied to the non-selected cells 200 in the same direction, as shown in FIG. 12. When such disturbance is caused, the information written in the non-selected cells 200 is lost to cause difficulty in employment of the ferroelectric memory. At present, therefore, it is considered difficult to put the ferroelectric memory having the simple matrix structure shown in FIGS. 9 and 10 into practice.

FIG. 13 is a circuit diagram showing a conventional one-transistor ferroelectric memory having memory cells formed by MFMIS-FETs, and FIG. 14 is a sectional view corresponding to FIG. 13. Referring to FIGS. 13 and 14, a well region 302 is formed on the surface of a semiconductor substrate 301 in this one-transistor ferroelectric memory. Source/drain regions 303 and 304 are formed on the surface of the well region 302 at prescribed intervals. Gate electrodes 306 are formed on channel regions located between the source/drain regions 303 and 304 through gate insulator films 305.

Word lines (WL) 308 are formed on the gate electrodes 306 through ferroelectric layers 307. Bit lines (BL) 310 are connected to the source/drain regions 304. Plate lines (PL) 311 are connected to the source/drain regions 303. Source lines (SL) 312 are connected to the well region 302. The gate electrodes 306, the ferroelectric layers 307 and the word lines 308 form ferroelectric capacitors 315. The source/drain regions 303 and 304, gate insulator films 305, and the gate electrodes 306 form transistors 309. In this case, each memory cell 300 is formed by a single transistor 309 having a single ferroelectric capacitor 315 provided on the gate portion thereof.

FIG. 15 is an equivalent circuit diagram of the one-transistor ferroelectric memory shown in FIGS. 13 and 14 in writing. When a write operation similar to that in the simple matrix ferroelectric memory shown in FIG. 11 is performed and a voltage $1/3V_{CC}$ is continuously applied to non-selected cells 300 in the same direction, therefore, information (charge quantity) in the non-selected cells 300 is lost in the so-called disturbance, similarly to the above.

SUMMARY OF THE INVENTION

An object of the present invention is to provide a ferroelectric memory capable of avoiding disturbance in non-selected memory cells.

Another object of the present invention is to put a simple matrix ferroelectric memory into practice by avoiding disturbance in non-selected cells.

Still another object of the present invention is to avoid disturbance in non-selected memory cells in a one-transistor ferroelectric memory.

In order to attain the aforementioned objects, a ferroelectric memory according to a first aspect of the present invention comprises a memory cell array formed by memory cells having ferroelectric capacitors arranged in the form of a matrix and pulse application means for applying pulses having a prescribed pulse width causing sufficient polarization inversion when applying a high voltage to the ferroelectric capacitors while hardly causing polarization inversion when applying a low voltage to the ferroelectric capacitors to the memory cells. The ferroelectric memory applies a pulse of a high voltage having the aforementioned prescribed pulse width to a selected memory cell while applying a pulse of a low voltage having the aforementioned prescribed pulse width to non-selected memory cells in at least either data writing or data reading. The wording "causing polarization inversion when applying a high voltage to a ferroelectric film" means that polarization inversion is caused when a high voltage is applied to the ferroelectric film storing data bringing the quantity of charges stored in the ferroelectric film into a negative state to enable data writing or reading.

The ferroelectric memory according to the first aspect is provided with the pulse application means for applying pulses having the prescribed pulse width causing sufficient polarization inversion when applying a high voltage to the ferroelectric capacitors while substantially hardly causing polarization inversion when applying a low voltage to the ferroelectric capacitors to the memory cells, as hereinabove described. When applying a pulse of a high voltage having the aforementioned prescribed pulse width to a selected memory cell while applying a pulse of a low voltage having the aforementioned prescribed pulse width to non-selected memory cells in at least either data writing or data reading, therefore, writing or reading can be performed on the selected memory cell while hardly causing polarization inversion in the non-selected memory cells. Consequently, disturbance can be avoided in the non-selected memory cells.

In the aforementioned ferroelectric memory according to the first aspect, the ferroelectric capacitors are preferably formed by bit lines, word lines arranged to intersect with the bit lines and ferroelectric layers arranged between the bit lines and the word lines. According to this structure, a simple matrix ferromagnetic memory can be formed. Disturbance can be avoided in non-selected memory cells, whereby the simple matrix ferromagnetic memory can be put into practice. In this case, the ferroelectric memory may apply the pulse of a high voltage having the prescribed pulse width to the ferroelectric capacitor of the selected memory cell while applying the pulse of a low voltage having the prescribed pulse width to the ferroelectric capacitors of the non-selected memory cells in both of writing and reading. According to this structure, disturbance in the non-selected memory cells can be avoided in both of writing and reading in the simple matrix ferroelectric memory.

In the aforementioned ferroelectric memory according to the first aspect, paraelectric capacitors are preferably serially connected to the ferroelectric capacitors. According to this structure, the voltages applied to the ferroelectric capacitors are reduced due to the connected paraelectric capacitors, and hence the voltages applied to the memory cells must be increased in order to equalize the voltages applied to the ferroelectric capacitors to those in the case of connecting no paraelectric capacitors. When the voltages applied to the memory cells are increased, the difference between the voltage applied to the selected cell and that applied to the non-selected cells is also increased, whereby voltage control can be more readily performed as compared with a case of small voltage difference.

In the aforementioned ferroelectric memory according to the first aspect, the ferroelectric capacitors preferably include ferroelectric layers provided on gate potions of first field-effect transistors. According to this structure, MFIS-FETs or MFMIS-FETs can be formed. In such an MFIS-FET or MFMIS-FET ferroelectric memory, disturbance can be avoided in the non-selected memory cells. In this case, the ferroelectric memory applies the pulse of a high voltage having the prescribed pulse width to the ferroelectric capacitor of the selected memory cell while applying the pulse of a low voltage having the prescribed pulse width to the ferroelectric capacitors of the non-selected memory cells only in writing. According to this structure, disturbance in the non-selected memory cells can be avoided in data writing in the MFIS-FET or MFMIS-FET ferroelectric memory.

The aforementioned ferroelectric memory according to the first aspect preferably applies a pulse of a prescribed voltage having the prescribed pulse width to the selected memory cell while applying a pulse of a voltage 1/3 the prescribed voltage having the prescribed pulse width to the non-selected memory cells. According to this structure, the difference between the voltage applied to the selected memory cell and that applied to the non-selected memory cells can be maximized. Consequently, disturbance in the non-selected memory cells can be more effectively avoided in addition to the aforementioned effect of avoiding disturbance.

In the aforementioned ferroelectric memory according to the first aspect, the ferroelectric capacitors preferably include ferroelectric layers, and the ferroelectric layers preferably contain at least one material selected from a group consisting of $SrBi_2Ta_2O_9$ (SBT), $SrBi_2(Nb,Ta)_2O_9$ (SBNT), $Pb(Zr,Ti)O_3$ (PZT), $(Pb,La)(Zr,Ti)O_3$ (PLZT), $(Bi,La)_4Ti_3O_{12}$ (BLT) and $Bi_4Ti_3O_{12}$ (BIT). When such a material is employed for the ferroelectric layers, the ferroelectric capacitors can be readily formed.

In the aforementioned ferroelectric memory according to the first aspect, the pulse application means preferably includes a first pulse application circuit included in a row decoder and a second pulse application circuit included in a column decoder. According to this structure, the pulses having the prescribed pulse width causing sufficient polarization inversion when applying a high voltage to the ferroelectric capacitors while hardly causing polarization inversion when applying a low voltage to the ferroelectric capacitors can be readily applied to the memory cells through the row decoder and the column decoder.

An operating method for a ferroelectric memory according to a second aspect of the present invention is an operating method for a ferroelectric memory comprising a memory cell array formed by memory cells having ferroelectric capacitors arranged in the form of a matrix and pulse application means for applying pulses having a prescribed pulse width causing sufficient polarization inversion when applying a high voltage to the ferroelectric capacitors while hardly causing polarization inversion when applying a low voltage to the ferroelectric capacitors to the memory cells, for applying a pulse of a high voltage having the aforementioned prescribed pulse width to a selected memory cell while applying a pulse of a low voltage having the aforementioned prescribed pulse width to non-selected memory cells in at least either data writing or data reading.

The operating method for a ferroelectric memory according to the second aspect is provided with the pulse application means for applying pulses having the prescribed pulse width causing sufficient polarization inversion when applying a high voltage to the ferroelectric capacitors while hardly causing polarization inversion when applying a low voltage to the ferroelectric capacitors to the memory cells, as hereinabove described. When applying a pulse of a high voltage having the aforementioned prescribed pulse width to a selected memory cell while applying a pulse of a low voltage having the aforementioned prescribed pulse width to non-selected memory cells in at least either data writing or data reading, therefore, writing or reading can be performed on the selected memory cell while hardly causing polarization inversion in the non-selected memory cells. Consequently, the operating method can avoid disturbance in the non-selected memory cells.

In this case, the operating method for a ferroelectric memory preferably applies a pulse of a prescribed voltage having the prescribed pulse width to the selected memory cell while applying a pulse of a voltage 1/3 the prescribed voltage having the prescribed pulse width to the non-selected memory cells. According to this structure, the difference between the voltage applied to the selected memory cell and that applied to the non-selected memory cells can be maximized. Thus, disturbance in the non-selected memory cells can be more efficiently avoided in addition to the aforementioned effect of avoiding disturbance.

In the aforementioned operating method for a ferroelectric memory according to the second aspect, the ferroelectric capacitors are preferably formed by bit lines, word lines arranged to intersect with the bit lines and ferroelectric layers arranged between the bit lines and the word lines. According to this structure, a simple matrix ferroelectric memory can be formed. Disturbance can be avoided in non-selected memory cells, whereby the simple matrix ferroelectric memory can be put into practice. In this case, the operating method for a ferroelectric memory may apply the pulse of a high voltage having the prescribed pulse width to the ferroelectric capacitor of the selected memory cell while applying the pulse of a low voltage having the prescribed pulse width to the ferroelectric capacitors of the non-selected memory cells in both of writing and reading. According to this structure, disturbance in non-selected memory cells can be avoided in both of writing and reading in the simple matrix ferroelectric memory.

In the aforementioned operating method for a ferroelectric memory according to the second aspect, paraelectric capacitors are preferably serially connected to the ferroelectric capacitors. According to this structure, the voltages applied to the ferroelectric capacitors are reduced due to the connected paraelectric capacitors, and hence the voltages applied to the memory cells must be increased in order to equalize the voltages applied to the ferroelectric capacitors to those in the case of connecting no paraelectric capacitors. When the voltages applied to the memory cells are increased, the difference between the voltage applied to the selected cell and that applied to the non-selected cells is also increased, whereby voltage control can be more readily performed as compared with a case of small voltage difference.

In the aforementioned operating method for a ferroelectric memory according to the second aspect, the ferroelectric capacitors preferably include ferroelectric layers provided on gate potions of first field-effect transistors. According to this structure, MFIS-FETs or MFMIS-FETs can be formed. In such an MFIS-FET or MFMIS-FET ferroelectric memory, disturbance can be avoided in non-selected memory cells. In this case, the operating method for a ferroelectric memory may apply the pulse of a high voltage having the prescribed pulse width to the ferroelectric capacitor of the selected memory cell while applying the pulse of a low voltage having the prescribed pulse width to the ferroelectric capacitors of the non-selected memory cells only in writing. According to this structure, disturbance in the non-selected memory cells can be avoided in data writing in the MFIS-FET or MFMIS-FET ferroelectric memory.

In the aforementioned operating method for a ferroelectric memory according to the second aspect, the ferroelectric capacitors preferably include ferroelectric layers, and the ferroelectric layers preferably contain at least one material selected from a group consisting of SBT, SBNT, PZT, PLZT, BLT and BIT. When such a material is employed for the ferroelectric layers, the ferroelectric capacitors can be readily formed.

In the aforementioned operating method for a ferroelectric memory according to the second aspect, the pulse application means preferably includes a first pulse application circuit included in a row decoder and a second pulse application circuit included in a column decoder. According to this structure, the pulses having the prescribed pulse width causing sufficient polarization inversion when applying a high voltage to the ferroelectric capacitors while hardly causing polarization inversion when applying a low voltage to the ferroelectric capacitors can be readily applied to the memory cells through the row decoder and the column decoder.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

Figure 1:
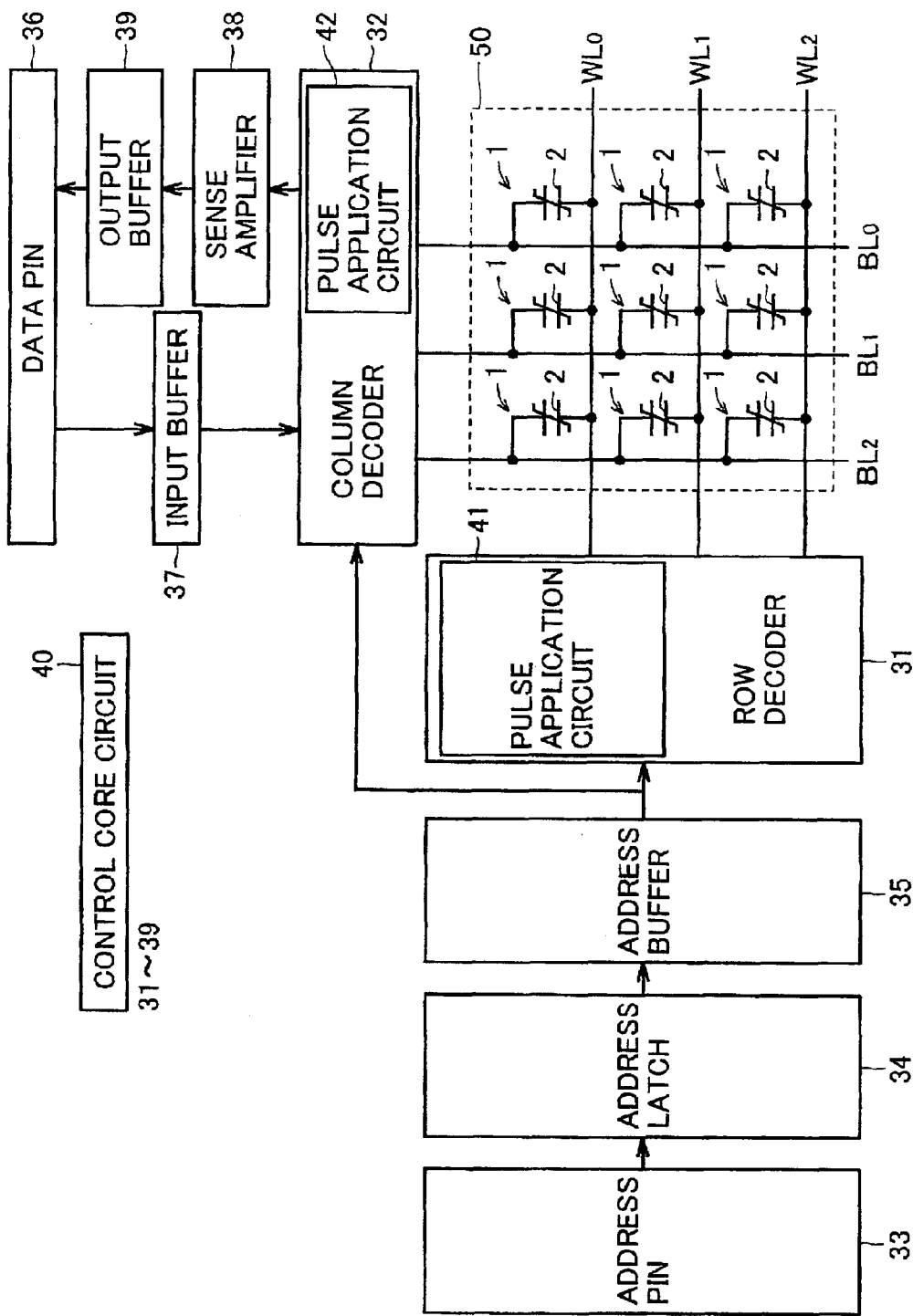
FIG. 1 is a circuit diagram showing the overall structure of a simple matrix ferroelectric memory according to a first embodiment of the present invention.
Figure 10:
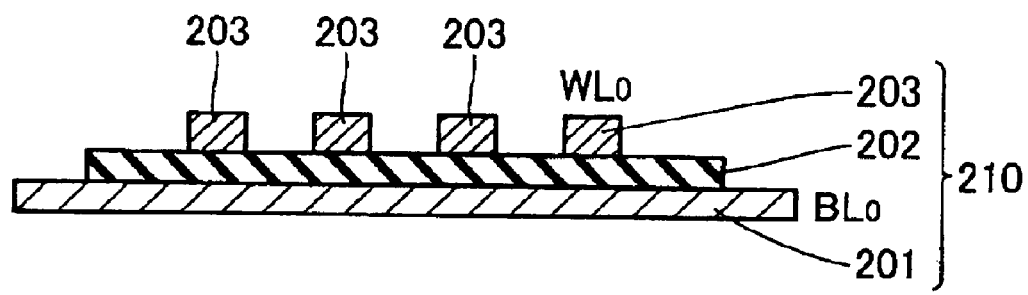
FIG. 10 is a sectional view of the conventional simple matrix ferroelectric memory shown in FIG. 9.
Figure 11:
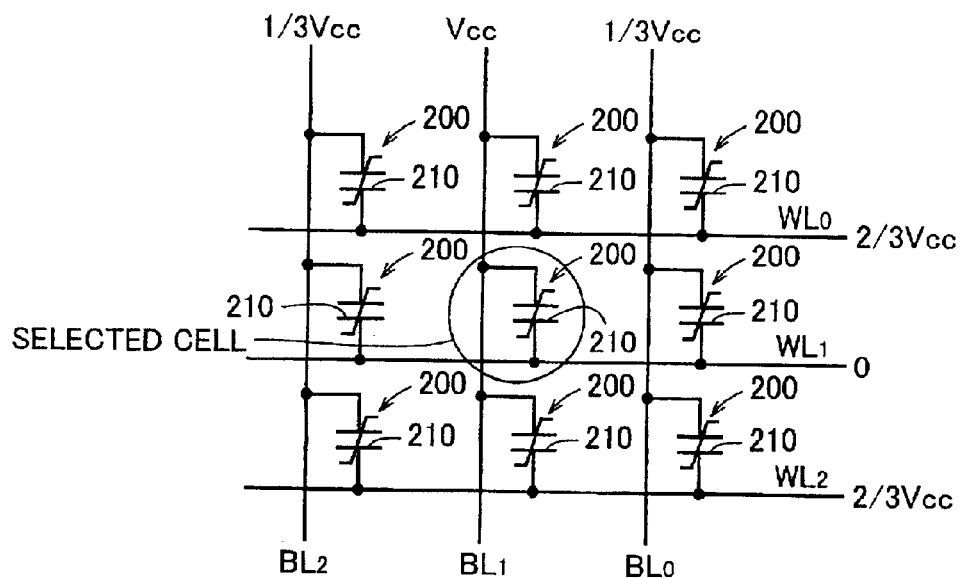
FIG. 11 is a circuit diagram for illustrating a voltage application state in a write operation of the conventional simple matrix ferroelectric memory shown in FIGS. 9 and 10.
Figure 12:
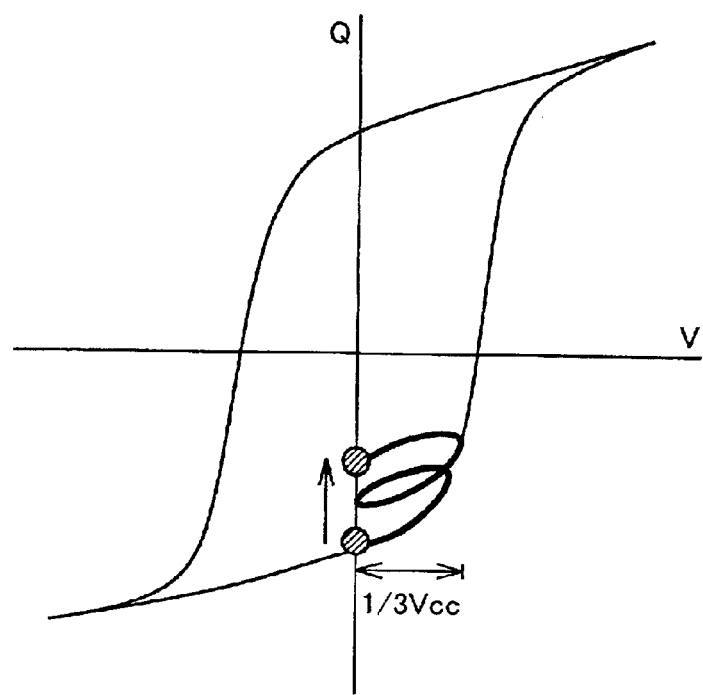
FIG. 12 shows ferroelectric hysteresis characteristics for illustrating a problem of the conventional simple matrix ferroelectric memory.
Figure 13:
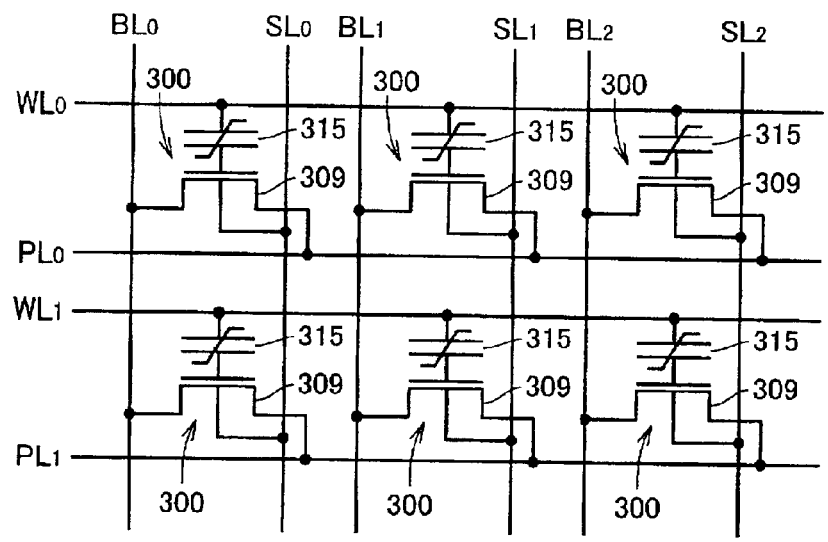
FIG. 13 is a circuit diagram of a memory cell array of a conventional one-transistor ferroelectric memory employing MFMIS-FETs.
Figure 14:
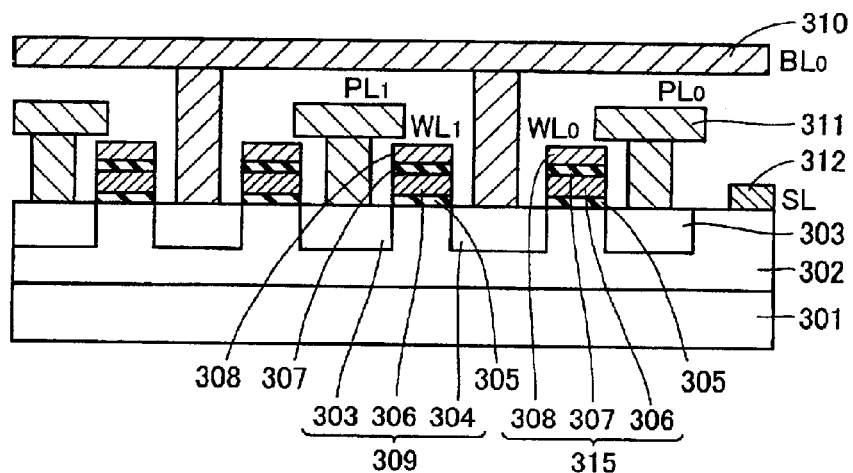
FIG. 14 is a sectional view of the one-transistor ferroelectric memory employing MFMIS-FETs shown in FIG. 13.

FIG. 1 is a circuit diagram showing the overall structure of a simple matrix ferroelectric memory according to a first embodiment of the present invention. In the simple matrix ferroelectric memory according to the first embodiment, a memory cell array 50 is formed by arranging a plurality of memory cells 1 in the form of a matrix (FIG. 1 shows only nine memory cells 1 for convenience of illustration). First terminals of ferroelectric capacitors 2 forming the memory cells 1 are connected to word lines $WL_0$ to $WL_2$, while second terminals are connected to bit lines $BL_0$ to $BL_2$. The memory cells 1 of the simple matrix ferroelectric memory, having a sectional structure similar to that of the conventional simple matrix ferroelectric memory shown in FIG. 10, has ferroelectric layers formed between the bit lines $BL_0$ to $BL_2$ and the word lines $WL_0$ to $WL_2$ arranged to intersect with the same.

The word lines $WL_0$ to $WL_2$ are connected to a row decoder 31. The bit lines $BL_0$ to $BL_2$ are connected to a column decoder 32.

Externally specified row and column addresses are input in an address pin 33. These row and column addresses are transferred from the address pin 33 to an address latch 34. In the addresses latched in the address latch 34, the row address is transferred to the row decoder 31 through an address buffer 35, while the column address is transferred to the column decoder 32 through the address buffer 35.

The row decoder 31 selects a word line corresponding to the row address latched in the address latch 34 from the word lines $WL_0$ to $WL_2$, for controlling the potential of each word line in correspondence to an operation mode.

The column decoder 32 selects a bit line corresponding to the column address latched in the address latch 34 from the bit lines $BL_0$ to $BL_2$, for controlling the potential of each bit line in correspondence to the operation mode.

According to the first embodiment, the row decoder 31 and the column decoder 32 include pulse application circuits 41 and 42 respectively. The pulse application circuits 41 and 42 apply pulses having a prescribed pulse width causing sufficient polarization inversion when applying a high voltage to the ferroelectric capacitors 2 while hardly causing polarization inversion when applying a low voltage to the ferroelectric capacitors 2 to the memory cells 1. The pulse application circuits 41 and 42 are examples of the "pulse application means" according to the present invention.

Externally specified data is input in a data pin 36. This data is transferred from the data pin 36 to the column decoder 32 through an input buffer 37. The column decoder 32 controls the potentials of the bit lines $BL_0$ to $BL_2$ to those corresponding to the data.

Data read from an arbitrary memory cell 1 is transferred to a sense amplifier 38 from each of the bit lines $BL_0$ to $BL_2$ through the column decoder 32. The sense amplifier 38 is a voltage sense amplifier. The data determined by the sense amplifier 38 is externally output from an output buffer 39 through the data pin 36.

A control core circuit 40 controls the operations of the aforementioned circuits 31 to 39.

Figure 2:
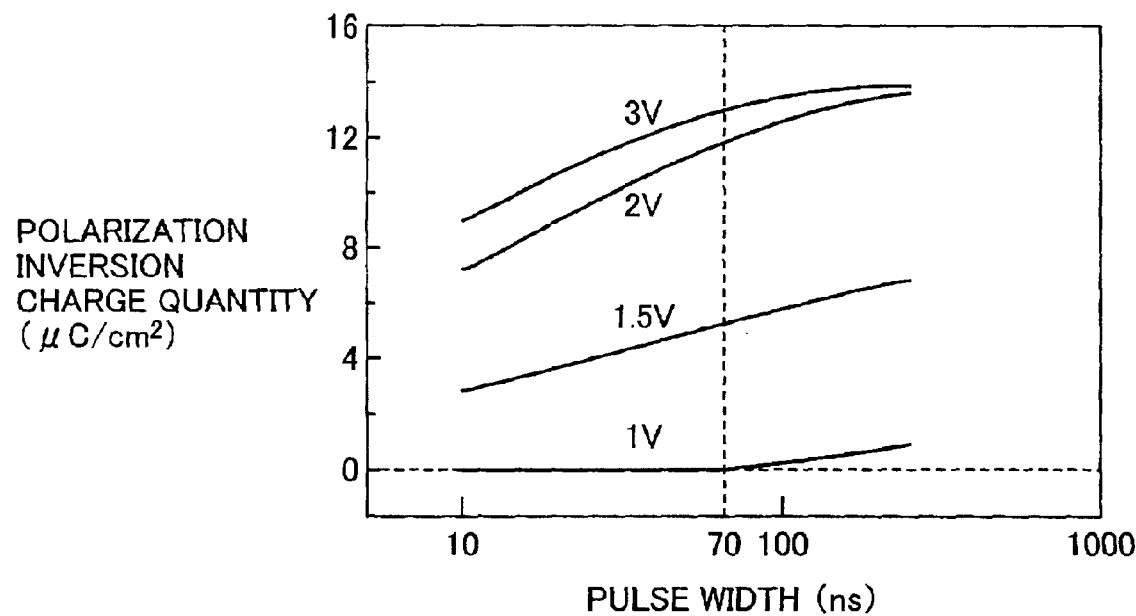
FIG. 2 is a correlation diagram for illustrating the operating principle of the simple matrix ferroelectric memory according to the first embodiment of the present invention.

FIG. 2 is a correlation diagram for illustrating the operating principle of the ferroelectric memory according to the first embodiment. This figure shows the relation between pulse widths and polarization inversion charge quantities with reference to parameters of applied voltages in a case of applying a pulse to a ferroelectric capacitor 2 employing an SBT film as a ferroelectric layer. As clearly understood from FIG. 2, the quantity of polarization inversion exhibits a charge quantity of more than 9 $\mu C/cm^2$ with reference to a pulse width of not more than 70 ns when the voltage is high (e.g., 3 V). It is also understood that polarization inversion is hardly caused when the voltage is low (e.g., 1 V).

Thus, the inventor has made deep study to find that a dipole of a ferroelectric substance is inverted under a high voltage while the dipole remains substantially unmoved under a low voltage when the pulse width is relatively short. On the basis of this, the inventor has devised such an operating principle that a voltage necessary for writing and reading can be applied to a ferroelectric layer of a selected cell while causing no change in ferroelectric layers of non-selected cells in molecular structure by applying a high voltage pulse to the selected cell with a short pulse width and applying a low voltage pulse to the non-selected cells with a short pulse width. According to this operating principle, a simple matrix ferroelectric memory can perform a memory operation with no disturbance.

Figure 3:
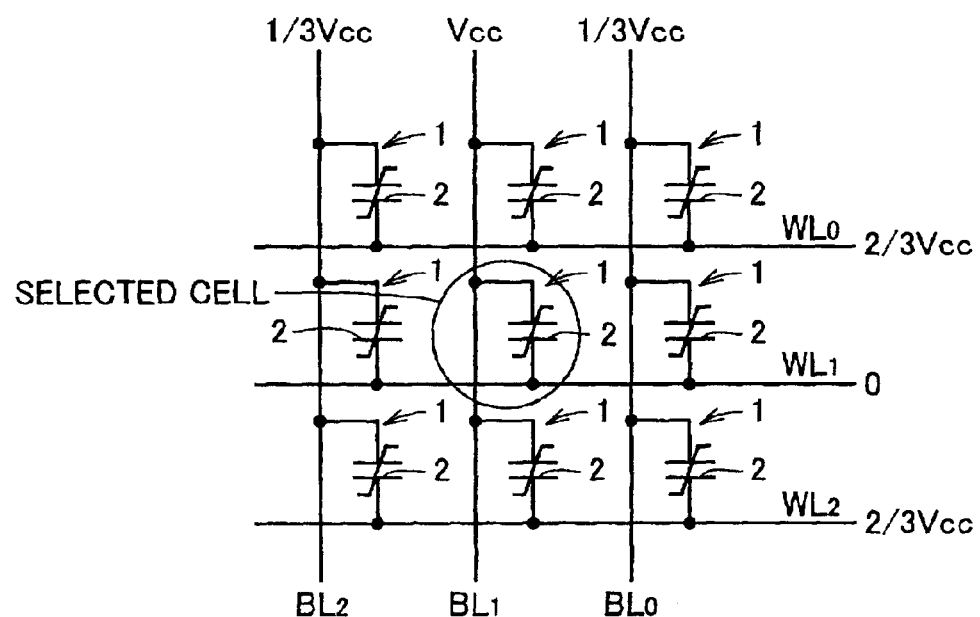
FIG. 3 is a circuit diagram showing an exemplary voltage application state in a write operation in the simple matrix ferroelectric memory according to the first embodiment shown in FIG. 1.
Figure 4:
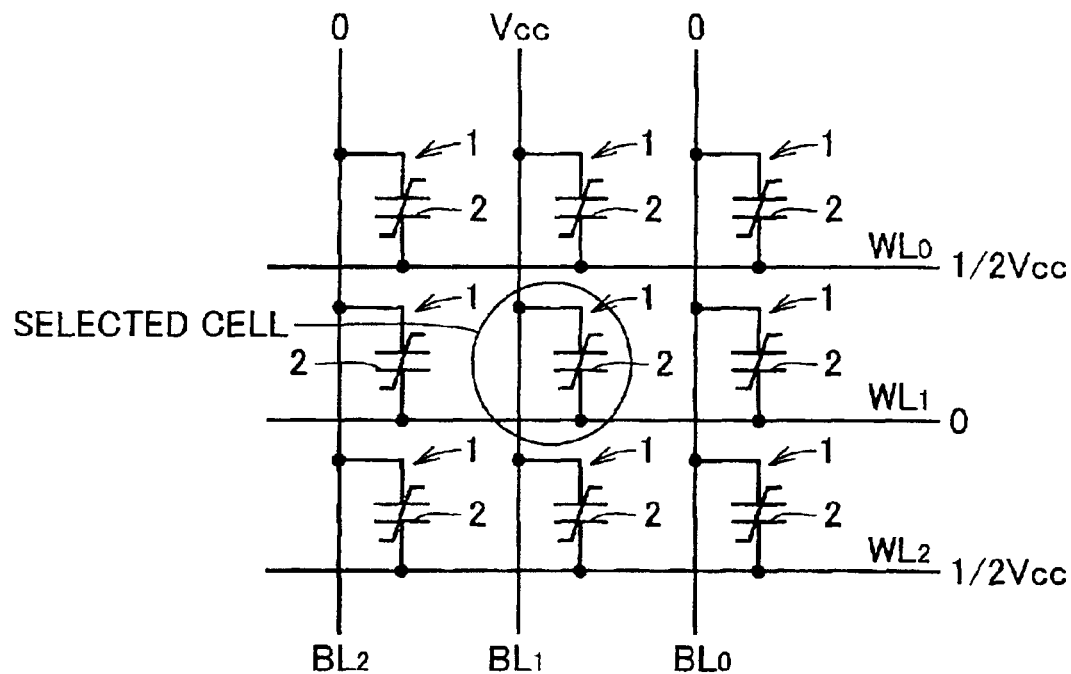
FIG. 4 is a circuit diagram showing another exemplary voltage application state in a write operation in the simple matrix ferroelectric memory according to the first embodiment shown in FIG. 1.

High and low voltages may be applied to selected and non-selected cells respectively by methods shown in FIGS. 3 and 4. FIG. 3 is a circuit diagram showing an exemplary voltage application state in a write operation in the simple matrix ferroelectric memory according to the first embodiment, and FIG. 4 is a circuit diagram showing another exemplary voltage application state in the write operation in the simple matrix ferroelectric memory according to the first embodiment.

In the voltage application method ($1/3V_{CC}$ method) shown in FIG. 3, a voltage pulse of a voltage $V_{CC}$ is applied to the bit line $BL_1$ connected with the selected cell 1, while 0 V is applied to the word line $WL_1$ connected with the selected cell 1 in the write operation. A voltage pulse of $1/3V_{CC}$ is applied to the bit lines $BL_0$ and $BL_2$ connected with the non-selected cells 1, while a voltage pulse of $2/3V_{CC}$ is applied to the word lines $WL_0$ and $WL_2$ connected with the non-selected cells 1. Thus, the voltage $V_{CC}$ is applied to the selected cell 1, while the voltage $1/3V_{CC}$ is applied to the non-selected cells 1. The pulse application circuits 41 and 42 shown in FIG. 1 apply these voltage pulses having a pulse width hardly causing polarization inversion in the ferroelectric capacitors 2 of the non-selected cells 1 while causing sufficient polarization inversion in the ferroelectric capacitor 2 of the selected cell 1. According to this structure, disturbance can be avoided in the non-selected memory cells 1 in the write operation of the simple matrix ferroelectric memory according to the first embodiment, whereby the simple matrix ferroelectric memory can be put into practice.

In the other voltage application method ($1/2V_{CC}$ method) shown in FIG. 4, a voltage pulse of the voltage $V_{CC}$ is applied to the bit line $BL_1$ connected with the selected cell 1, while 0 V is applied to the word line $WL_1$ connected with the selected cell 1 in the write operation. 0 V is applied to the bit lines $BL_0$ and $BL_2$ connected with the non-selected cells 1, while a voltage pulse of $1/2V_{CC}$ is applied to the word lines $WL_0$ and $WL_2$ connected with the non-selected cells 1. Thus, the voltage pulse of the voltage $V_{CC}$ is applied to the selected cell 1, while the voltage pulse of the voltage $1/2V_{CC}$ is applied to the non-selected cells 1. Also in this case, the pulse application circuits 41 and 42 shown in FIG. 1 apply voltage pulses having a pulse width causing sufficient polarization inversion in the ferroelectric capacitor 2 of the selected cell 1 with the voltage $V_{CC}$ applied thereto while hardly causing polarization inversion in the ferroelectric capacitors 2 of the non-selected cells 1 with the voltage $1/2V_{CC}$ applied thereto to the selected and non-selected cells 1. Also according to this structure, disturbance can be avoided in the non-selected memory cells 1 in the write operation of the simple matrix ferroelectric memory according to the first embodiment, whereby the simple matrix ferroelectric memory can be put into practice.

Comparing the voltage application methods shown in FIGS. 3 and 4 with each other, the non-selected cells 1 are more hardly inverted in the voltage application method shown in FIG. 3 applying a lower voltage ($1/3V_{CC}$) to the non-selected cells 1. Therefore, the voltage application method shown in FIG. 3 is more preferable than that shown in FIG. 4.

In the voltage application method ($1/3V_{CC}$ method) shown in FIG. 3, the voltage pulse of the voltage $1/3V_{CC}$ is first applied to the word lines $WL_0$, $WL_1$ and $WL_2$ while applying the voltage pulse of the voltage $2/3V_{CC}$ to the bit lines $BL_0$, $BL_1$ and $BL_2$ in reading. From this state, the bit line $BL_1$ connected with the selected cell 1 is temporarily set to 0 V and thereafter brought into a floating state, while setting the word line $WL_1$ connected with the selected cell 1 to the voltage $V_{CC}$. The sense amplifier 38 shown in FIG. 1 detects the level of the potential change of the bit line $BL_1$, thereby determining whether the data is "1" or "0". Thus, the data can be read.

Figure 5:
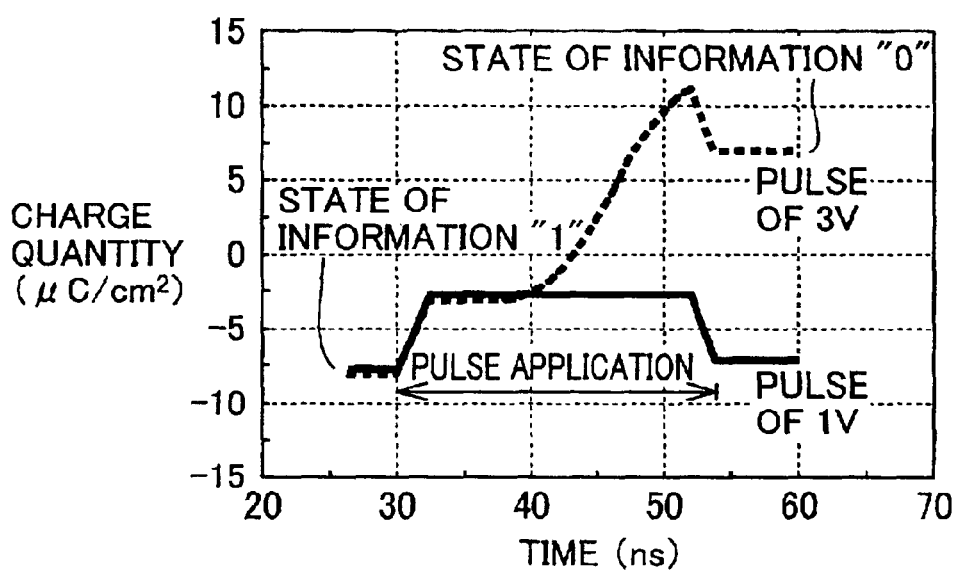
FIG. 5 is a correlation diagram showing results of an experiment performed for confirming the operating state of the ferroelectric memory according to the first embodiment shown in FIG. 1.

FIG. 5 is a correlation diagram showing results of an experiment performed for confirming the operating state of the ferroelectric memory according to the first embodiment. Referring to FIG. 5, a voltage of −3 V was first applied to each ferroelectric capacitor 2 thereby writing information "1" therein in this embodiment. FIG. 5 shows change of the charge quantity of the ferroelectric capacitor 2 thereafter subjected to application of pulses of 3 V and 1 V. The pulse width of the pulses of 3 V and 1 V was set to 20 ns.

It is clearly understood from FIG. 5 that polarization inversion was sufficiently caused when the pulse of 3 V having the pulse width of 20 ns was applied while polarization inversion was hardly caused when the pulse of 1 V having the pulse width of 20 ns was applied. Thus, it is understood that information can be written in and read from the ferroelectric layer of the selected cell 1 while causing no change in the ferroelectric layers of the non-selected cells 1 by applying a pulse of a high voltage to the selected cell 1 and applying a pulse of a low voltage to the non-selected cells 1 with pulses having a pulse width causing sufficient polarization inversion under a high voltage and hardly causing polarization inversion under a low voltage.

Second Embodiment

Figure 6:
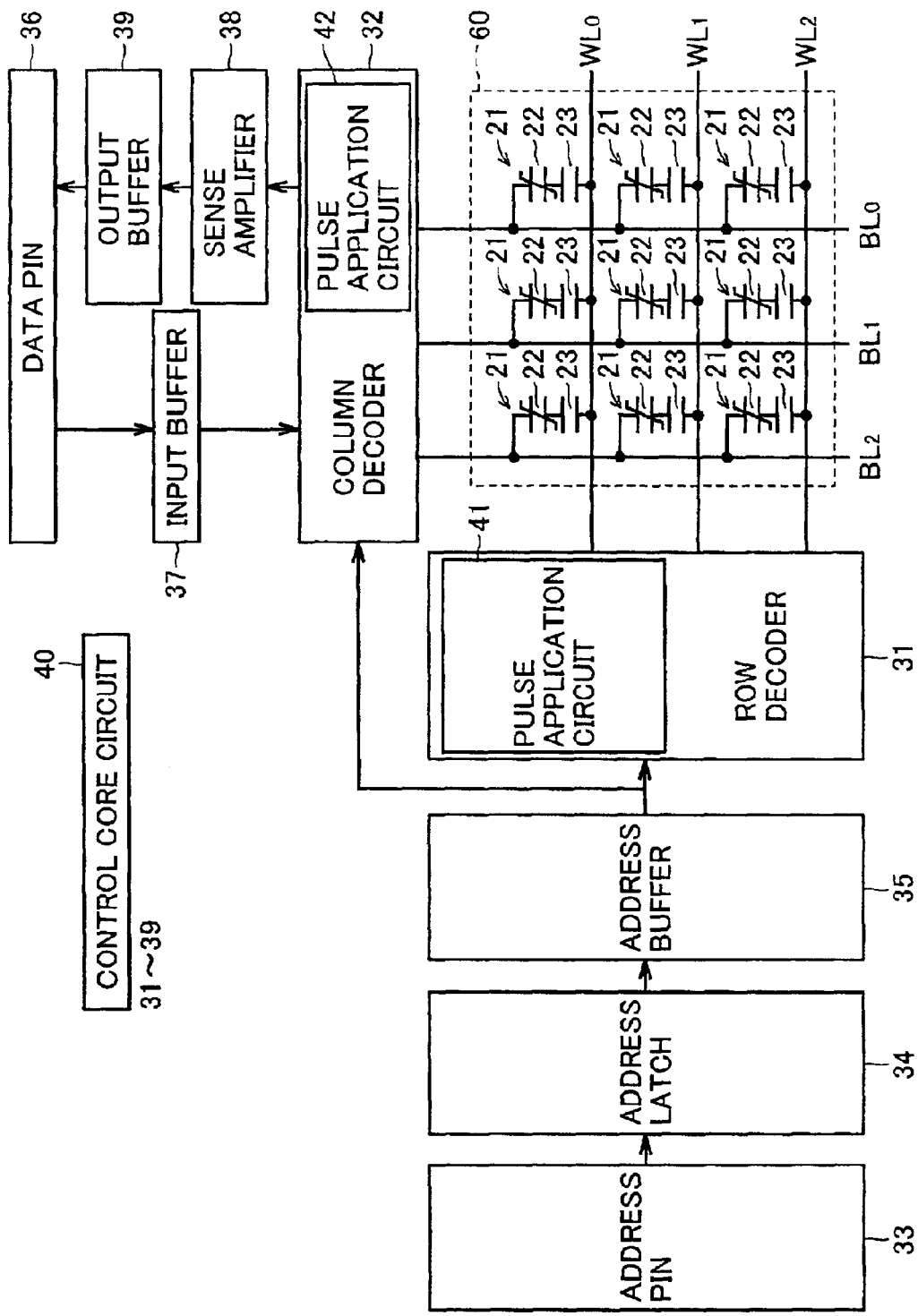
FIG. 6 is a circuit diagram showing the overall structure of a simple matrix ferroelectric memory according to a second embodiment of the present invention.
Figure 7:
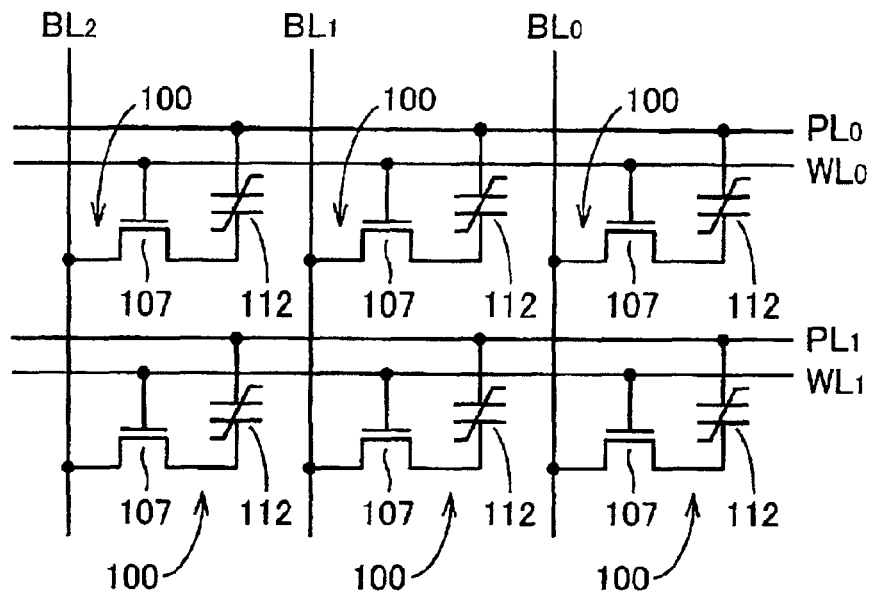
FIG. 7 is a circuit diagram showing the circuit structure of a memory cell array of a most general conventional ferroelectric memory.
Figure 8:
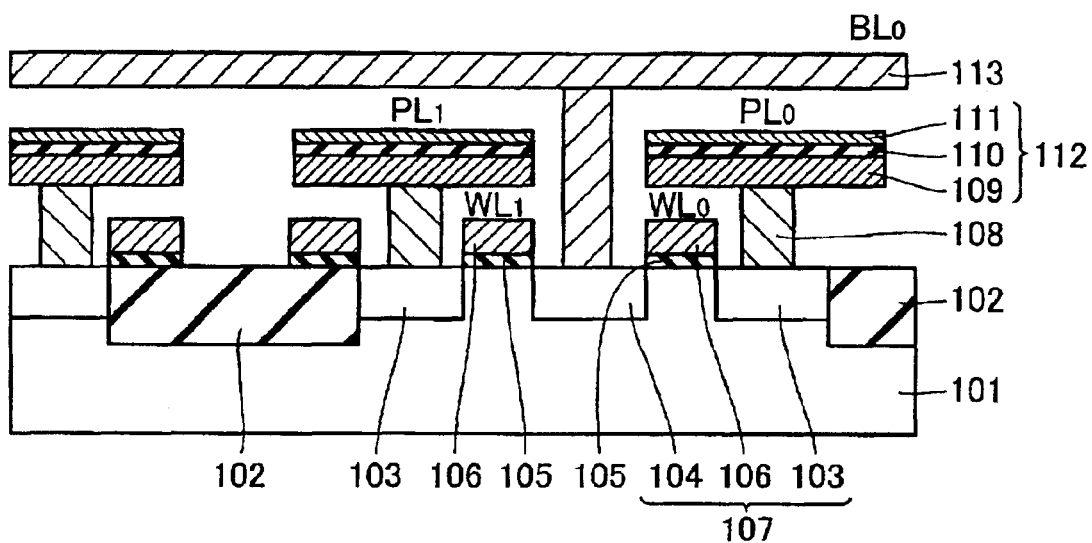
FIG. 8 is a sectional view corresponding to the circuit diagram shown in FIG. 7.
Figure 9:
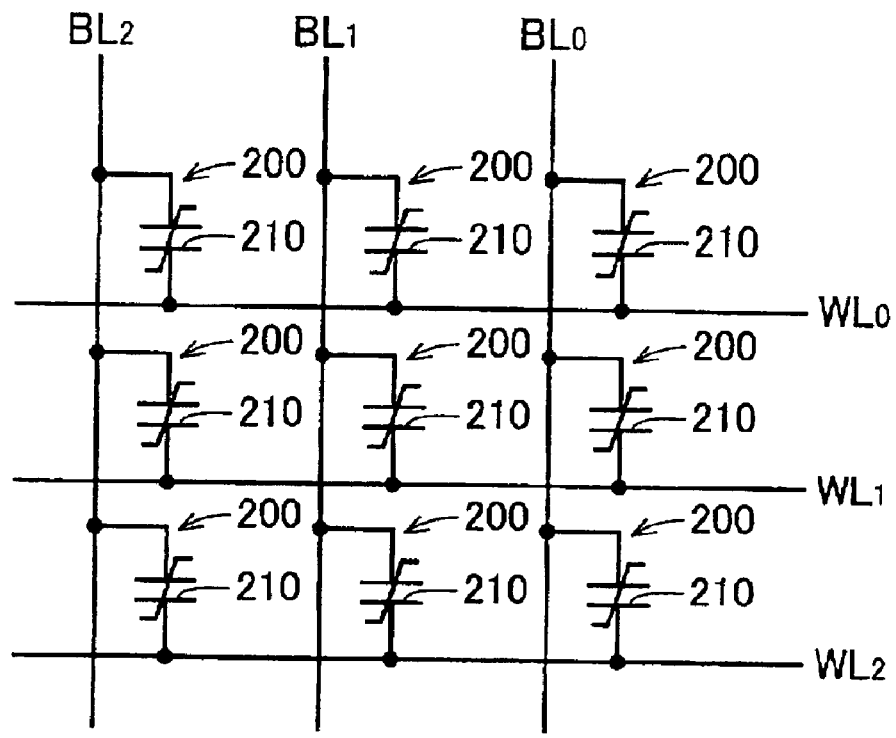
FIG. 9 is a circuit diagram showing the circuit structure of a memory cell array of a conventional simple matrix ferroelectric memory.

FIG. 6 is a circuit diagram showing the overall structure of a simple matrix ferroelectric memory according to a second embodiment of the present invention. The ferroelectric memory according to the second embodiment has a structure obtained by serially connecting a paraelectric capacitor to a ferroelectric capacitor of each memory cell in a structure similar to that of the simple matrix ferroelectric memory according to the first embodiment.

According to the second embodiment, each memory cell 21 forming a memory cell array 60 is formed by a ferroelectric capacitor 22 and a paraelectric capacitor 23 serially connected to the ferroelectric capacitor 22. In this case, a voltage applied to the simple matrix ferroelectric capacitor 22 is in inverse proportion to the capacity ratio between the ferroelectric capacitor 22 and the paraelectric capacitor 23. When the ratio of the capacity of the ferroelectric capacitor 22 to the capacity of the paraelectric capacitor 23 is 1:2, for example, it follows that 2/3 the applied voltage is applied to the ferroelectric capacitor 22. In this case, the voltage $V_{CC}$ is changed to $3/2V_{CC}$ so that the same voltage as that shown in FIG. 3 or 4 is applied to the ferroelectric capacitor 22.

In other words, the voltages applied to the selected and non-selected cells 21 are increased to 3/2 times as compared with the case shown in FIG. 3 or 4. When the voltages applied to the memory cells 21 are increased in such a manner, the difference between the voltages applied to the selected and non-selected cells 21 is so increased that voltage control can be more readily performed as compared with a case of small voltage difference. In other words, the voltages can be readily controlled due to the structure according to the second embodiment also when the voltage $V_{CC}$ has a small value and is hard to control.

Figure 15:
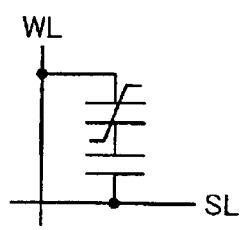
FIG. 15 is an equivalent circuit diagram of the one-transistor ferroelectric memory employing MFMIS-FETs shown in FIG. 13 in a write operation.

While the paraelectric capacitor 23 is serially connected to the ferroelectric capacitor 22 in the structure according to the second embodiment similar to that of the simple matrix structure according to the first embodiment shown in FIG. 1, the circuit diagram of the memory cell 21 of the ferroelectric memory according to the second embodiment shown in FIG. 6 is identical to the equivalent circuit in the one-transistor ferroelectric memory employing the MFMIS-FETs shown in FIG. 15 in writing. Therefore, the circuit structure of the ferroelectric memory according to the second embodiment is also applicable to a one-transistor ferroelectric memory employing MFMIS-FETs (or MFIS-FETs).

Also in the one-transistor ferroelectric memory employing MFIS-FETs or MFMIS-FETs, therefore, information can be written in a ferroelectric layer of a selected cell while causing no change in ferroelectric layers of non-selected cells by applying a high voltage having a prescribed pulse width to the ferroelectric capacitor formed on a gate portion of the selected cell while applying a low voltage having the prescribed pulse width to the ferroelectric capacitors formed on gate portions of the non-selected cells. Consequently, disturbance can be avoided in a writing operation of the one-transistor ferroelectric memory.

Although the present invention has been described and illustrated in detail, it is clearly understood that the same is by way of illustration and example only and is not to be taken by way of limitation, the spirit and scope of the present invention being limited only by the terms of the appended claims.

For example, while the ferroelectric layers are formed by SBT films in the aforementioned first and second embodiments, the present invention is not restricted to this but the ferroelectric layers may alternatively be made of SBNT, PZT, PLZT, BLT, BIT or a following material. In other words, all ferroelectric layers having polarization inversion characteristics provided with a pulse width causing sufficient polarization inversion when applying a high voltage to the ferroelectric layers while hardly causing polarization inversion when applying a low voltage can be employed.

While the aforementioned embodiments have been described with reference to a simple matrix ferroelectric memory and a one-transistor ferroelectric memory employing MFIS-FETs or MFMIS-FETS, the present invention is not restricted to this but is also applicable to any ferroelectric memory causing polarization inversion by applying a high voltage to a selected memory while causing no polarization inversion by applying a low voltage to non-selected memory cells at least in either a write operation or a read operation.

What is claimed is:

1. A ferroelectric memory comprising:

a memory cell array formed by memory cells having ferroelectric capacitors arranged in the form of a matrix; and pulse application means for applying pulses having a prescribed pulse width causing sufficient polarization inversion when applying a high voltage to said ferroelectric capacitors while hardly causing polarization inversion when applying a low voltage to said ferroelectric capacitors to said memory cells, for applying a pulse of a high voltage having said prescribed pulse width to selected said memory cell while applying a pulse of a low voltage having said prescribed pulse width to non-selected said memory cells in at least either data writing or data reading.

2. The ferroelectric memory according to claim 1, wherein said ferroelectric capacitors are formed by bit lines, word lines arranged to intersect with said bit lines and ferroelectric layers arranged between said bit lines and said word lines.

3. The ferroelectric memory according to claim 2, applying said pulse of a high voltage having said prescribed pulse width to said ferroelectric capacitor of said selected memory cell while applying said pulse of a low voltage having said prescribed pulse width to said ferroelectric capacitors of said non-selected memory cells in both of writing and reading.

4. The ferroelectric memory according to claim 1, wherein paraelectric capacitors are serially connected to said ferroelectric capacitors.

5. The ferroelectric memory according to claim 1, wherein said ferroelectric capacitors include ferroelectric layers provided on gate potions of first field-effect transistors.

6. The ferroelectric memory according to claim 5, applying said pulse of a high voltage having said prescribed pulse width to said ferroelectric capacitor of said selected memory cell while applying said pulse of a low voltage having said prescribed pulse width to said ferroelectric capacitors of said non-selected memory cells only in writing.

7. The ferroelectric memory according to claim 1, applying a pulse of a prescribed voltage having said prescribed pulse width to said selected memory cell while applying a pulse of a voltage 1/3 said prescribed voltage having said prescribed pulse width to said non-selected memory cells.

8. The ferroelectric memory according to claim 1, wherein said ferroelectric capacitors include ferroelectric layers, and said ferroelectric layers contain at least one material selected from a group consisting of SBT, SBNT, PZT, PLZT, BLT and BIT.

9. The ferroelectric memory according to claim 1, wherein said pulse application means includes:

a first pulse application circuit included in a row decoder, and a second pulse application circuit included in a column decoder.

10. An operating method for a ferroelectric memory comprising a memory cell array formed by memory cells having ferroelectric capacitors arranged in the form of a matrix and pulse application means for applying pulses having a prescribed pulse width causing sufficient polarization inversion when applying a high voltage to said ferroelectric capacitors while hardly causing polarization inversion when applying a low voltage to said ferroelectric capacitors to said memory cells, said method applying a pulse of a high voltage having said prescribed pulse width to selected said memory cell while applying a pulse of a low voltage having said prescribed pulse width to non-selected said memory cells in at least either data writing or data reading.

11. The operating method for a ferroelectric memory according to claim 10, applying a pulse of a prescribed voltage having said prescribed pulse width to said selected memory cell while applying a pulse of a voltage 1/3 said prescribed voltage having said prescribed pulse width to said non-selected memory cells.

12. The operating method for a ferroelectric memory according to claim 10, wherein said ferroelectric capacitors are formed by bit lines, word lines arranged to intersect with said bit lines and ferroelectric layers arranged between said bit lines and said word lines.

13. The operating method for a ferroelectric memory according to claim 12, applying said pulse of a high voltage having said prescribed pulse width to said ferroelectric capacitor of said selected memory cell while applying said pulse of a low voltage having said prescribed pulse width to said ferroelectric capacitors of said non-selected memory cells in both of writing and reading.

14. The operating method for a ferroelectric memory according to claim 10, wherein paraelectric capacitors are serially connected to said ferroelectric capacitors.

15. The operating method for a ferroelectric memory according to claim 10, wherein said ferroelectric capacitors include ferroelectric layers provided on gate potions of first field-effect transistors.

16. The operating method for a ferroelectric memory according to claim 15, applying said pulse of a high voltage having said prescribed pulse width to said ferroelectric capacitor of said selected memory cell while applying said pulse of a low voltage having said prescribed pulse width to said ferroelectric capacitors of said non-selected memory cells only in writing.

17. The operating method for a ferroelectric memory according to claim 10, wherein said ferroelectric capacitors include ferroelectric layers, and said ferroelectric layers contain at least one material selected from a group consisting of SBT, SBNT, PZT, PLZT, BLT and BIT.

18. The operating method for a ferroelectric memory according to claim 10, wherein said pulse application means includes:

a first pulse application circuit included in a row decoder, and a second pulse application circuit included in a column decoder.

* * * * *